United States Patent [19]

Moyer

[11] 4,451,905
[45] May 29, 1984

[54] ELECTRICALLY ERASABLE PROGRAMMABLE READ-ONLY MEMORY CELL HAVING A SINGLE TRANSISTOR

[75] Inventor: Norman E. Moyer, Balboa, Calif.

[73] Assignee: Hughes Aircraft Company, El Segundo, Calif.

[21] Appl. No.: 334,946

[22] Filed: Dec. 28, 1981

[51] Int. Cl.³ .............................................. G11C 11/40
[52] U.S. Cl. ...................................... 365/185; 365/104
[58] Field of Search ............... 365/174, 182, 185, 218, 365/189, 104; 357/23 VT

[56] References Cited

U.S. PATENT DOCUMENTS 4,112,509  9/1978  Wall ...................................... 365/185
4,241,424  12/1980  Dickson et al. ...................... 365/218
4,377,857  3/1983  Tickle ................................... 365/185

Primary Examiner—Joseph A. Popek
Attorney, Agent, or Firm—J. Holtrichter, Jr.; A. W. Karambelas

[57] ABSTRACT

An electrically erasable programmable read-only memory, comprising a plurality of floating gate tunneling metal oxide semiconductor field effect transistors, does not require an addressing transistor in each cell. Instead, the gate decoder applies a sufficiently negative gate voltage to unselected ones of the transistors so that they are turned off regardless of the amount of charge on their floating polysilicon gates. Writing and erasure of data is performed without disturbing data in memory cells not selected for writing or erasure despite the absence of a series connected addressing transistor.

18 Claims, 4 Drawing Figures

ELECTRICALLY ERASABLE PROGRAMMABLE READ-ONLY MEMORY CELL HAVING A SINGLE TRANSISTOR

TECHNICAL FIELD

This invention is related to electrically erasable programmable read-only memories (EEPROM's) comprising a variable threshold voltage metal oxide semiconductor (VTVMOS) field effect transistor (FET) in each memory cell.

BACKGROUND ART

Electrically erasable programmable read-only memories (EEPROM's) became practical with the advent of the variable threshold voltage metal oxide semiconductor (VTVMOS) field effect transistor (FET), the VTVMOS FET being described in U.S. Pat. No. 4,115,914 by Eliyahou Harari, entitled "Electrically Erasable Non-Volatile Semiconductor Memory" and assigned to the assignee of the present application. Typically, the VTVMOS FET includes a source, a drain, an overlying control gate and a polysilicon floating gate formed beneath the control gate and overlying the source and at least a portion of the source-to-drain channel. The dielectric insulation under the polysilicon floating gate has a thin "tunneling" spot on the order of 100 angstroms thickness overlying the source. As is well known in the art, data may be stored permanently in a memory comprising an array of such VTVMOS FETs by simply causing electrons to tunnel through the thin spot in the dielectric insulation between the source and the floating polysilicon gate. Such tunneling of electrons between the source and the floating gate changes the charge on the floating gate and thus the threshold voltage of the VTVMOS FET.

One problem in the prior art is that if an excess of electrons tunnels between the floating gate and the source during a non-volatile storage or "write" operation, the threshold voltage of the VTVMOS FET may be decreased so much that the VTVMOS FET cannot be turned off during normal operation of the memory. For example, in an n-channel VTVMOS FET, electrons may tunnel from the floating polysilicon gate to the source in such a great number that the polysilicon gate acquires a large positive charge. If the positive charge is sufficient, the threshold voltage of the n-channel VTVMOS FET (as measured by varying the voltage of the control gate) may be decreased from the usual threshold of $+1$ volt to a negative voltage on the order of $-1.5$ volts. The operating voltage of such memory arrays typically varies between $+5$ volts (for "on") and 0 volts (for "off"), the latter being insufficient to turn off such an excessively charged VTVMOS FET. Accordingly, the VTVMOS transistor cannot be "unselected" and therefore will distort data read out of the memory from a selected memory cell sharing the same output node.

One possible solution is to control the writing voltages applied to the gate and the source in such a manner as to prevent excessive charging of the floating polysilicon gate. This solution has the disadvantage that it is difficult to control the electron tunneling current between the floating gate and the source. Accordingly, attempting to prevent excessive charging of the floating gate during a writing step is impractical.

A more practical solution is the addition in each memory cell of a series connected addressing field effect transistor having a single control gate which controls the selection of the VTVMOS FET in the cell. The addition of an extra transistor in each memory cell decreases the the density of the memory array and increases access time, both significant disadvantages.

SUMMARY OF THE INVENTION

The present invention is an EEPROM comprising an array of VTVMOS FETs of the type disclosed in the Harari patent referred to above, each memory cell comprising a single one of the VTVMOS transistors and not requiring the presence of an extra addressing transistor in the memory cell. The EEPROM of the present invention prevents a false reading of data from unselected VTVMOS FETs even if the floating gate of one of them has been depleted or charged excessively. The excessively depleted VTVMOS FET is prevented from distorting the data read from the memory by forcing a large negative voltage (on the order of $-5$ volts) onto the overlying control gates of unselected VTVMOS FETs. This large negative voltage is sufficient to turn off source-to-drain channel current even if the floating gate has been excessively charged. Accordingly, there is no necessity for an extra addressing transistor to prevent a false readout of data. None of the source or drain pn junctions in the array may be forward biased during writing and erasure operations. This situation is avoided by the complementary structure of the invention wherein the VTVMOS FETs are of a first conductivity-type and are formed in a well region of a second conductivity-type on a substrate of the first conductivity type. This structure includes means for varying the potential of the well region in such a manner as to prevent forward biasing any of the source or drain pn junctions during reading, writing or erasing.

Thus, the invention includes a method of storing information, comprising fabricating the foregoing complementary micro-electronic structure and then operating it in the manner described herein.

DESCRIPTION OF THE DRAWINGS

The invention is best understood by reference to the accompanying drawings, of which.

DETAILED DESCRIPTION OF THE INVENTION

Figure 1:
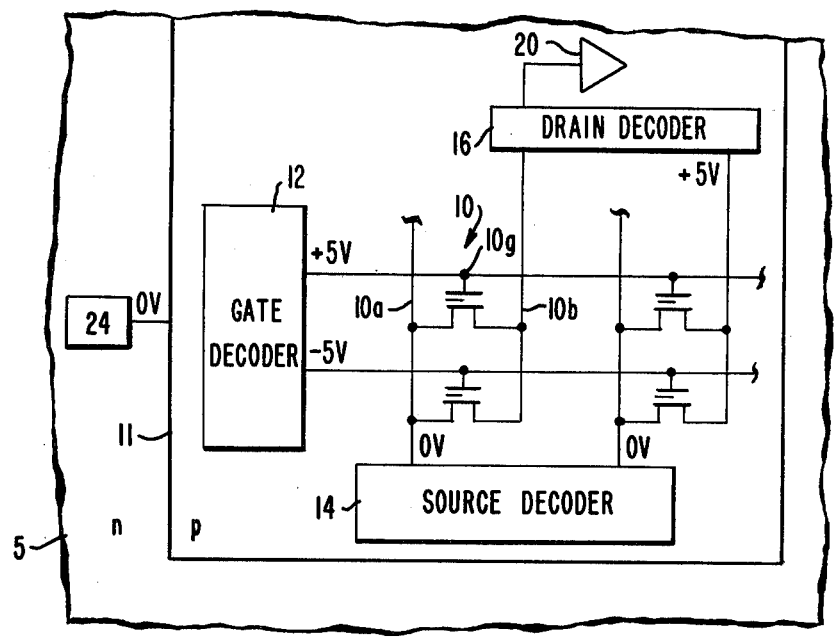
FIG. 1 is a simplified schematic diagram of the EEPROM array of this invention.
Figure 2:
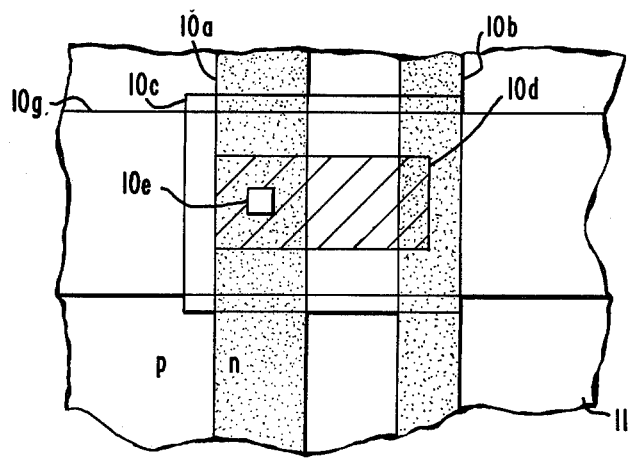
FIG. 2 is a simplified plan view of the VTVMOS FET comprising a single memory cell in the array of FIG. 1, and is of the type well known in the prior art.

Referring to FIG. 1, the novel EEPROM of this invention is formed on a semiconductor substrate 5 and comprises an array of n-channel VTVMOS FETs 10 organized by row and column and formed in a p-type well 11 on the substrate 5. Each of the VTVMOS FETs 10 is controlled by a gate decoder 12, a source decoder 14, and a drain decoder 16, each decoder being formed in the substrate 5. Each VTVMOS FET 10 is of the type illustrated in FIG. 2 and was previously described in U.S. Pat. No. 4,115,914 filed by Eliyahou Harari and assigned to the assignee of the present application. The VTVMOS transistor 10 of FIG. 2 includes source and drain diffusions 10a, 10b of n-type conductivity which are shared with other VTVMOS transistors in the same column. A floating polysilicon gate 10c is insulated from the substrate 5 by a dielectric layer having a thin ("gate oxide") region 10d overlying the source-to-drain channel and an extremely thin spot 10e overlying source diffusion 10a through which electrons may tunnel between the source diffusion 10a and the floating polysilicon gate 10c. A metal control gate 10g overlies the floating gate 10c and is insulated therefrom by another thin layer.

The gate decoder 12 is connected to each control gate 10g shared by VTVMOS transistors in the same row. The source decoder 14 is connected to source diffusions 10a shared by VTVMOS transistors in the same column while the drain decoder 16 is connected to drain diffusions 10b shared by VTVMOS transistors in the same column.

A well control circuit 24 controls the potential of the well 11 during reading, writing and erasing so that none of the sources 10a or drains 10b becomes forward-biased with respect to the well 11.

READING

A method for reading data from the memory of this invention is illustrated in FIG. 1. A VTVMOS FET 10 in a particular row and column may be selected for reading to the exclusion of all other VTVMOS FETs in the array as follows: the gate decoder 12 applies +5 volts to the control gate 10g of the selected row wherein the selected VTVMOS FET 10 resides. Simultaneously, the gate decoder 12 continuously applies −5 volts to the control gates of all other rows of VTVMOS FETs. The source decoder 14 maintains 0 volts on all the source diffusions 10a. The drain decoder connects the drain diffusions 10b of the selected column (wherein the selected VTVMOS FET 10 resides) to a sense amplifier 20. All of these operations are performed in two steps tabulated in the following table.

TABLE I

| Subcircuit | Output Terminal | Precharging Step 1 (Before Reading) | Step 2 Reading |
|---|---|---|---|
| gate decoder | selected gate | −5 volts | +5 volts |
|  | unselected gates | −5 volts | −5 volts |
| drain decoder | selected drain | +5 volts | to sense amplifier |
|  | unselected drain | +5 volts | not used |
| source decoder | all sources | 0 volts | 0 volts |
| well control circuit | well | 0 volts | 0 volts |
|  | substrate | +5 volts | +5 volts |

As shown in Table I above, the reading operation includes a precharging step in which all of the drain diffusions 10b are first precharged to +5 volts while all of the transistors in the array are turned off by keeping all gate voltages below the source voltage. Accordingly, if the floating gate 10c of the selected VTVMOS FET 10 has been depleted of electrons, the source-to-drain impedance of the VTVMOS FET 10 is lower than it would be if the floating gate were not charged. Thus, at the instant the gate decoder 12 applies +5 volts to the control gate 10g, the sense amplifier 20 detects a relatively faster movement in the potential of the drain diffusion 10b downward from +5 volts toward 0 volts. Conversely, if the floating gate 10c has an excess of electrons stored on it, the source-to-drain impedance of the VTVMOS FET 10 is higher than it would be if the floating gate were not charged. Thus, the sense amplifier 20 detects a relatively slower movement in the potential of the drain diffusion 10b. Accordingly, the sense amplifier 20 either senses a faster change in the drain potential (a logic "one") or senses slower change in the drain potential (a logic "zero").

One problem solved in this invention is that an unselected VTVMOS FET in the same column with the selected VTVMOS FET 10 may have had its floating gate excessively depleted of electrons during a previous writing operation so that it has become a depletion mode field effect transistor (that is to say, a field effect transistor which is normally "on"). In the prior art, the gate decoder 12 would have merely applied 0 volts to the control gates of all of the unselected rows of VTVMOS FETs, which is insufficient to turn off an unselected VTVMOS FET having an excessively charged floating gate. The unselected FET would therefore distort the drain potential sensed by the sense amplifier 20, giving rise to a false reading. However, in the present invention the gate decoder 12 applies −5 volts to the control gates all of the unselected rows of VTVMOS FETs in the selected column, which causes all the unselected VTVMOS FETs in that column to be turned off, including those having excessively charged floating gates.

WRITING AND ERASING

Figure 3:
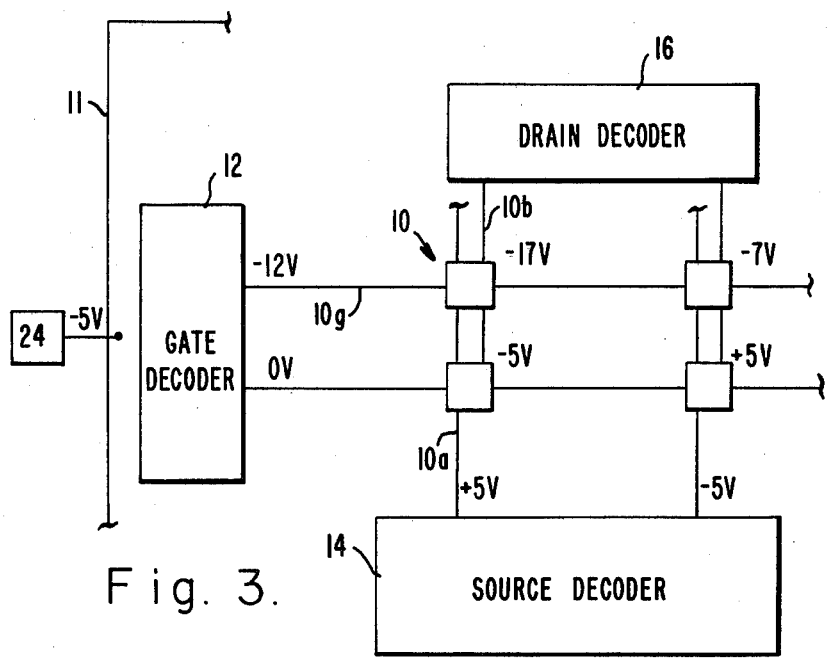
FIG. 3 is a simplified schematic diagram of the memory array of FIG. 1 illustrating the erase step.
Figure 4:
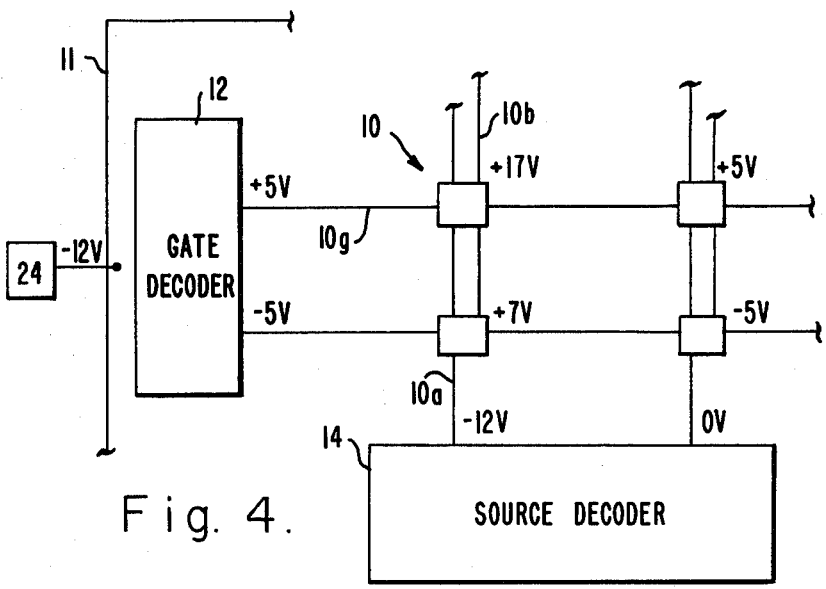
FIG. 4 is a simplified schematic diagram of the memory array of FIG. 1 illustrating the writing step.

The erasing and writing operations are summarized in Table II below and are illustrated in FIGS. 3 and 4 respectively.

TABLE II

| Subcircuit | Output Terminal | Operation Erase | Write |
|---|---|---|---|
| source decoder | selected source | +5 volts | −12 volts |
|  | unselected source | −5 volts | 0 volts |
| gate decoder | selected gate | −12 volts | +5 volts |
|  | unselected gate | 0 volts | −5 volts |
| drain decoder | all drains | floating | floating |
| well control circuit | well | −5 volts | −12 volts |
|  | substrate | +5 volts | +5 volts |

Data is written or erased in selected memory cells without affecting data previously stored in the unselected memory cells of the array. The purpose of the erase operation is to withdraw electrons from the floating gate 10c to the source 10a through the tunneling spot 10e; the purpose of the write operation is to store electrons on the polysilicon floating gate 10c by supplying them from the source 10a through the tunneling spot 10e to the gate 10c. During writing, tunneling of electrons from the source 10a to the floating gate 10c requires that the floating gate 10c be at a positive potential (typically on the order of 17 volts) with respect to the source 10a; during erasing, tunneling of electrons from the floating gate 10c to the source 10a requires that the floating gate be at a negative potential (typically on the order of −17 volts) with respect to the source 10a.

FIG. 3 denotes the voltages applied during the erase operation by the gate decoder 12 and by the source decoder 14. During erasure, the gate decoder 12 applies −12 volts to the selected control gate 10g and 0 volts to the unselected control gates of the array, while the source decoder 14 applies +5 volts to the selected source 10a and −5 volts to the unselected sources in the remainder of the array. Simultaneously, the well control circuit 24 applies −5 volts to the well 11 to prevent forward biasing the pn junctions between the unselected sources and the well.

FIG. 3 also denotes the resulting control gate-to-source potentials during erasure in each of the VTVMOS FETs in the array. The selected VTVMOS FET 10 has a gate-to-source potential of −17 volts, which is sufficient to cause electron tunneling from the floating gate 10c. As illustrated in FIG. 3, the other unselected VTVMOS FETs have control gate-to-source voltages of either −7, −5 or +5 volts depending upon their location, which voltages are insufficient to cause electrons to tunnel between the floating gate and the source.

During the write operation illustrated in FIG. 4, the gate decoder 12 applies +5 volts to the control gate 10g of the selected row of VTVMOS FETs and −5 volts to the control gates of the unselected rows of VTVMOS FETs. The source decoder 14 applies −12 volts to the source diffusion of the selected column of VTVMOS FETs and 0 volts to the source diffusions of the remaining unselected columns of VTVMOS FETs. Simultaneously, the well control circuit 24 applies −12 volts to the well 11 to prevent forward biasing the pn junction between the selected source 10a and the well 11. The resulting control gate-to-source potential of the selected VTVMOS FET 10 is +17 volts. This is sufficient to cause electrons to tunnel from the source 10a to the floating gate 10c so that the floating gate 10c acquires a negative charge. As illustrated in FIG. 4, the unselected VTVMOS FETs in the array have control gate-to-source voltages of either +7, +5 or −5 volts depending upon their location, which voltages are insufficient to cause tunneling of electrons between the source and the floating gate.

In summary, the memory array of this invention is more dense than prior art memory arrays which used a VTVMOS FET in combination with a series connected addressing FET in each memory cell. At the same time, the memory array of this invention is bit-addressable in the writing and erasure operations. A complementary metal oxide semiconductor (CMOS) structure, wherein each n-channel VTVMOS FET is formed in a common p-type well on an n-type substrate, prevents the source and drain junctions from forward biasing. More importantly, it permits operating the VTVMOS FETs in a well, the voltage of which is less negative than the supply voltage of the gate decoder (−5 volts). This is necessary (but not mandatory) to reduce efects of well voltage on threshold voltage, sometimes called "back gate bias" in the art. This feature makes it easier to physically implement the novel reading, writing and erasing means of this invention without requiring of an extra addressing transistor in each memory cell. It is possible, of course, to implement the present invention without the complementary well by selecting a large substrate voltage, which is not as desirable as the preferred embodiment disclosed herein.

What is claimed is:

1. A memory formed on a semiconductor comprising:
   A. an array of transistors comprising:
      (1) common source and drain diffusions of a first conductivity type extending in a plurality of parallel columns,
      (2) common insulated control electrodes extending over said parallel columns in a plurality of parallel rows;
      (3) a plurality of insulated floating gates juxtaposed between various pairs of adjacent ones of said source and drain diffusions and underlying respective ones of said control electrodes,
      (4) an insulating layer surrounding said floating gates including a plurality of thin tunneling regions between the source and floating gate of each transistor;
   B. means for reading including means for applying one voltage to a selected overlying control electrode and for applying a different voltage to the other ones of said overlying control electrodes, said different voltage being sufficient to turn off transistors having charged floating gates;
   C. means for erasing including:
      (1) means for applying a first voltage to the source diffusion of a selected one of said columns and a second voltage to the unselected source diffusions of the remaining ones of said columns, and
      (2) means for applying a third voltage to a selected one of said control electrodes and a fourth voltage to the remaining ones of said control electrodes; and
   D. means for writing including:
      (1) means for applying a fifth voltage to the source diffusion of a selected one of said columns and a sixth voltage to the unselected source diffusions of the remaining ones of said columns, and
      (2) means for applying a seventh voltage to a selected one of said control electrodes and an eighth voltage to the remaining ones of said control electrodes.

2. The memory of claim 1 further comprising a well of conductivity type opposite to said sources and drains and containing said sources and drains, and means for controlling the potential of said well so as to prevent forward bias current flow between said well and any of said common source and drain diffusions.

3. The memory of claim 1 wherein said reading means applies a positive voltage on the order of 5 volts to the control gates of selected transistors and a negative voltage on the order of −5 volts to the control gates of unselected transistors.

4. The memory of claims 1 or 3 wherein said third and fifth voltages are about equal, said fourth and sixth voltages are about equal, said first and seventh voltages are about equal and said second and eighth voltages are about equal.

5. A memory formed on a semiconductive layer of a first conductivity type, comprising:
   A. a well region of a second conductivity type formed in said semiconductive layer;
   B. a plurality of transistors formed in said well region, comprising:
      (1) common source and drain diffusions of said first conductivity type extending in a plurality of parallel columns,
      (2) a plurality of common insulated control electrodes extending in a plurality of parallel rows over said common source and drain diffusions;
      (3) a plurality of insulated floating gates juxtaposed between adjacent source and drain columns, overlying said well region under said insulated control electrodes and separated therefrom by an insulating layer having a plurality of tunneling regions therein underlying said plurality of floating gates, C. means for reading including means for applying a particular voltage to a selected one of said control electrodes and applying a different voltage to the remaining control electrodes;

D. means for charging a selected one of said floating gates by applying a first voltage to the corresponding source diffusion and applying a second voltage to the remaining source diffusions while applying a third voltage to the selected one of said overlying control electrodes and applying a fourth voltage to the remaining ones of said overlying control electrodes, wherein the sum of said first and third voltages is sufficient to cause charge to tunnel between said well region and said selected one floating gate and wherein the sum of any other two of said first, second, third and fourth voltages is insufficient to cause charge to tunnel between a corresponding source and floating gate;

E. means for discharging a selected one of said floating gates by applying voltages as in Step D above, except that said first and third and said second and fourth voltages are interchanged, respectively; and F. means for controlling the potential of said well region so as to prevent a forward bias current between said well region and any of said source and drain diffusions.

6. The memory of claim 5 wherein said particular voltage and said different voltage of said reading means are on the order of +5 volts and −5 volts respectively, and wherein said first and second voltages and said third and fourth voltages of said charging and discharging means are, alternatively, on the order of −12 volts, 0 volts, +5 volts, −5 volts, respectively, or +5 volts, −5 volts, −12 volts and 0 volts, respectively.

7. The memory of claims 5 or 6 wherein said well region potential controlling means operates in synchronism with said charging and discharging means so as to maintain a zero or a reverse bias potential between said well region and all of said common source and drain diffusions.

8. A memory comprising:
a plurality of floating gate tunneling semiconductor field effect transistors organized in an array of rows and columns, each of said rows and columns comprising a plurality of said transistors, each of said columns including common source and drain diffusions of a first conductivity-type and each of said rows including a common overlying control gate electrode, each of said transistors having an individual insulated floating gate and a thin region in the insulation thereof permitting tunneling of electrons between said floating gate and the corresponding one of said source diffusions; and means for reading, including:
means for applying a particular voltage to the overlying control electrode of a selected row and a different voltage to the overlying control electrodes of unselected rows, wherein said different voltage is sufficient to turn off transistors having charged floating gates, and means for sensing the change in source-to-drain current of the drain diffusion of a selected one of said columns.

9. The memory of claim 8 further comprising a source decoder connected to the source diffusions of said columns.

10. The memory of claim 9 wherein said source decoder includes writing means for applying a first voltage to the source diffusion of a selected column and a second voltage to the source diffusion of unselected columns.

11. The memory of claim 10 wherein said source decoder includes erasing means for applying a third voltage to the source diffusion of a selected column and applying a fourth voltage to the source diffusion of unselected ones of said columns.

12. The memory of claim 8 wherein said first conductivity type is n, said particular voltage is a positive voltage and said different voltage is a negative voltage.

13. The memory of claims 8, 9, 10, 11 or 12 wherein said transistors are formed in a common well of a second conductivity-type on a semiconductive substrate of said first conductivity-type, said memory further comprising means for controlling the potential of said well so as to prevent a forward bias potential between any of said diffusions and said well.

14. A method for storing information in a non-volatile manner in a semiconductor comprising:
forming common sources and drains in said semiconductor as a plurality of parallel columns;
forming a first plurality of insulated floating electrodes overlying a first plurality of regions between said source and drain columns and a dielectric layer therebetween having a plurality of thin tunneling regions therein overlying said sources;
forming common insulated control electrodes overlying said plurality of floating electrodes and overlying said source and drain columns, said control electrodes comprising a plurality of rows;
selecting one of said floating gates for reading by applying a particular voltage to the corresponding overlying control electrode and applying a different voltage to the remaining ones of said overlying control electrodes, said different voltage being sufficient to prevent source to drain current flow beneath unselected ones of said floating gates;
writing on a selected one of said floating gates by applying a first voltage to the source diffusion of the corresponding one of said columns and a second voltage to the remaining ones of said source diffusions while applying a third voltage to the corresponding one of said control electrodes and a fourth voltage to the remaining control electrodes;
erasing a selected one of said floating gates by applying a fifth voltage to the source diffusion of a selected one of said columns and a sixth voltage to remaining ones of said source diffusions, applying a seventh voltage to the corresponding control electrode and an eighth voltage to the remaining control electrodes.

15. The method of claim 14, further comprising the steps of forming a complementary well region in said semiconductor, said well region containing said source and drain columns, and controlling the potential of said well region so as to prevent a forward bias current between said well region and any of said common source and drain diffusions.

16. The method of claim 14 wherein the sum of said first and third voltages, or of said fifth and seventh voltages, is sufficient to cause tunneling of charge through said tunneling region.

17. The method of claims 14 or 16 wherein sums of voltage pairs other than said first and second voltages or said fifth and seventh voltages are insufficient to cause charge to tunnel through said tunneling region between said well region and said selected floating gate.

18. The method of claim 14 wherein some of said first, second, third, fourth, fifth, sixth, seventh and eighth voltages are about equal to others of said voltages.

* * * * *